(12) United States Patent
Endo et al.

(10) Patent No.: US 7,939,242 B2
(45) Date of Patent: May 10, 2011

(54) BARRIER FILM MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 536 days.

(21) Appl. No.: 12/046,996

(22) Filed: Mar. 12, 2008

(65) Prior Publication Data

US 2008/0233491 A1 Sep. 25, 2008

(30) Foreign Application Priority Data

Mar. 23, 2007 (JP) ................................. 2007-076351

(51) Int. Cl.
 *G03F 7/00* (2006.01)
 *G03F 7/004* (2006.01)
 *G03F 7/26* (2006.01)
 *G03F 7/20* (2006.01)
 *G03F 7/40* (2006.01)

(52) U.S. Cl. .................. 430/270.1; 430/273.1; 430/331; 430/396

(58) Field of Classification Search ............... 430/270.1, 430/273.1, 331, 396
See application file for complete search history.

(56) References Cited

U.S. PATENT DOCUMENTS

| | | | | |
|---|---|---|---|---|
| 5,854,357 A * | 12/1998 | Sato et al. | ................... | 525/359.3 |
| 7,141,355 B2 * | 11/2006 | Iwanaga et al. | ............. | 430/287.1 |
| 7,608,386 B2 * | 10/2009 | Nozaki et al. | ............... | 430/271.1 |
| 7,670,750 B2 * | 3/2010 | Harada et al. | ............... | 430/270.1 |
| 7,700,260 B2 * | 4/2010 | Kanna et al. | ................ | 430/270.1 |
| 7,781,141 B2 * | 8/2010 | Gallagher et al. | ......... | 430/270.1 |
| 2007/0212646 A1 * | 9/2007 | Gallagher et al. | ......... | 430/270.1 |
| 2008/0032242 A1 * | 2/2008 | Masuda et al. | ................ | 430/327 |
| 2008/0241745 A1 * | 10/2008 | Shirakawa et al. | ........ | 430/281.1 |

OTHER PUBLICATIONS

Switkes, M. et al., "Immersion lithography at 157 nm," J. Vac. Sci. Technology, vol. B19, p. 2353-2356, 2001.
Smith, B.W. et al., "Approaching the numerical aperture of water-Immersion Lithography at 193 nm," Proc. SPIE, vol. 5377, p. 273-284, 2004.

* cited by examiner

*Primary Examiner* — Amanda C. Walke
(74) *Attorney, Agent, or Firm* — McDermott Will & Emery LLP

(57) ABSTRACT

A barrier film material includes, in addition to an alkali-soluble polymer, a multivalent carboxylic acid compound having a plurality of carboxyl groups or a multivalent alcohol compound. Thus, the multivalent carboxylic acid compound or the multivalent alcohol compound is adhered onto the surface of a resist film, and hence, particles having been adhered to the surface of the resist film are removed in removing the barrier film. Also, in the case where the barrier film is removed simultaneously with development, the resist film can be prevented from remaining partly undissolved.

25 Claims, 12 Drawing Sheets

HEAT

HEAT

BARRIER FILM MATERIAL AND PATTERN FORMATION METHOD USING THE SAME

CROSS-REFERENCE TO RELATED APPLICATIONS

This application claims priority under 35 U.S.C. §119 on Patent Application No. 2007-76351 filed in Japan on Mar. 23, 2007, the entire contents of which are hereby incorporated by reference.

BACKGROUND OF THE INVENTION

The present invention relates to a barrier film material for use in immersion exposure technique employed in fabrication process or the like for semiconductor devices and a pattern formation method using the same.

In accordance with the increased degree of integration and downsizing of semiconductor devices, there are increasing demands for further rapid development of lithography technique. Currently, pattern formation is carried out through photolithography using exposing light of a mercury lamp, KrF excimer laser, ArF excimer laser or the like. Furthermore, use of $F_2$ laser of a shorter wavelength has been examined, but since there are a large number of problems in exposure systems and resist materials, the development in the use of the $F_2$ laser is now being suspended. In these circumstances, immersion lithography has been recently proposed for realizing further refinement of patterns by using conventional exposing wavelengths (for example, see M. Switkes and M. Rothschild, "Immersion lithography at 157 nm", J. Vac. Sci. Technol., Vol. B19, p. 2353 (2001)). In the immersion lithography, a region in an exposure system sandwiched between a lens and a resist film formed on a wafer is filled with a liquid having a refractive index n and therefore, the NA (the numerical aperture) of the exposure system has a value n·NA. As a result, the resolution of the resist film can be improved. Also, use of an acidic solution has been recently proposed for further improving the refractive index of the liquid (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a conventional pattern formation method employing the immersion lithography will be described with reference to FIGS. 12A through 12D, 13A and 13B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Next, as shown in FIG. 12A, the aforementioned chemically amplified resist material is applied on a substrate 601 so as to form a resist film 602 with a thickness of 0.35 μm.

Then, as shown in FIG. 12B, by using a barrier film material having the following composition, a barrier film 603 is formed on the resist film 602:

| | |
|---|---|
| Alkali-soluble polymer: polyvinyl hexafluoroisopropyl alcohol | 1 g |
| Solvent: n-butyl alcohol | 20 g |

Next, as shown in FIG. 12C, the resultant barrier film 603 is annealed with a hot plate at a temperature of 120° C. for 90 seconds, so as to improve the denseness of the barrier film 603.

Then, as shown in FIG. 12D, with an immersion liquid 605 of water provided on the annealed barrier film 603 by, for example, a puddle method, pattern exposure is carried out by irradiating the resist film 602 through the barrier film 603 with exposing light 607 of ArF excimer laser with NA of 0.68 having passed through a mask 606.

After the pattern exposure, as shown in FIG. 13A, the resist film 602 is baked with a hot plate at a temperature of 105° C. for 60 seconds.

Nest, the barrier film 603 is removed by using a 2.38 wt % tetramethylammonium hydroxide aqueous solution (an alkaline developer) and the resultant resist film is developed. In this manner, a resist pattern 602a made of an unexposed portion of the resist film 602 and having a line width of 0.09 μm is formed as shown in FIG. 13B.

However, as shown in FIG. 13B, the resist pattern 602a obtained by the conventional pattern formation method is in a defective shape.

SUMMARY OF THE INVENTION

The present inventors have made various examinations on the reason why the resist pattern formed by the conventional immersion lithography is in a defective shape, resulting in finding the following: Particles generated through the contact between a barrier film and a resist film inhibit the development of the resist film, and hence, the resist film cannot be uniformly developed. Furthermore, when there remains an undissolved portion of the resist film after the development, the resultant pattern is in a defective shape.

When such a resist pattern 602a in a defective shape is used for etching a target film, a resultant pattern of the target film is also in a defective shape, and therefore, the productivity and the yield of the fabrication process for semiconductor devices are disadvantageously lowered.

In consideration of the aforementioned conventional problems, an object of the invention is forming a fine resist pattern in a good shape by preventing the influence on a resist film of a liquid for the immersion exposure technique used in the immersion lithography.

The present inventors have found the following based on the results of the aforementioned examinations: A multivalent carboxylic acid compound having a plurality of carboxyl groups is included in a barrier film material in addition to an alkali-soluble polymer. Since the number of carboxyl groups included in the multivalent carboxylic acid compound is larger than that of a compound having only one carboxyl group, the multivalent carboxylic acid compound is easily adhered onto the surface of a resist film. At this point, the multivalent carboxylic acid compound adhered onto the surface of the resist film dissolves a surface portion of the resist film. Therefore, particles having been adhered to the surface of the resist film are removed in removing the barrier film. Furthermore, in the case where the barrier film is removed simultaneously with the development, the resist film can be prevented from remaining partly undissolved.

Alternatively, a multivalent alcohol compound having a plurality of hydroxyl groups is included in a barrier film material. Since the number of hydroxyl groups included in the multivalent alcohol compound is larger than that of a compound having only one hydroxyl group, the multivalent alcohol compound is easily adhered onto the surface of a resist film. At this point, the wettability of the barrier film against the resist film is improved owing to the influence of the multivalent alcohol compound adhered onto the surface of the resist film. Therefore, particles having been adhered to the surface of the resist film are removed in removing the barrier film. Furthermore, in the case where the barrier film is removed simultaneously with the development, the resist film can be prevented from remaining partly undissolved.

When a barrier film including a multivalent carboxylic acid compound or a multivalent alcohol compound as in this invention is used, out of a plurality of compositions included in the barrier film, merely the multivalent carboxylic acid compound or the multivalent alcohol compound has strong affinity with a resist film material and hence is adhered onto the surface of the resist film. On the other hand, even when a multivalent carboxylic acid compound or a multivalent alcohol compound is included in a resist film, the multivalent carboxylic acid compound or the multivalent alcohol compound is merely randomly present in the resist film. Accordingly, it is necessary to prepare, separately from a resist film, a barrier film that has a different composition from a resist film material, prevents the influence of a liquid on the resist film and is closely adhered onto the surface of the resist film.

Examples of the multivalent carboxylic acid compound used in this invention are a saturated aliphatic carboxylic acid compound, an unsaturated aliphatic carboxylic acid compound, a saturated cyclic carboxylic acid compound and an aromatic carboxylic acid compound. A saturated aliphatic carboxylic acid compound or an unsaturated aliphatic carboxylic acid compound has a chain structure and hence has a high degree of freedom. Therefore, it has an advantage that it is easily adhered onto the surface of a resist film.

Furthermore, a saturated cyclic carboxylic acid compound or an aromatic carboxylic acid compound can include three or more carboxylic groups owing to its structure. Therefore, it has an advantage that it can be easily adhered onto the surface of a resist film and can easily dissolve a surface portion of the resist film.

Specific examples of the saturated aliphatic carboxylic acid compound usable in the invention are malonic acid, succinic acid, glutaric acid, adipic acid, pimelic acid, suberic acid, azelaic acid and sebacic acid, which do not limit the invention.

Specific examples of the unsaturated aliphatic carboxylic acid compound usable in the invention are fumaric acid and maleic acid, which do not limit the invention.

Specific examples of the saturated cyclic carboxylic acid compound usable in the invention are 1,2-cyclohexanedicarboxylic acid, 1,3-cyclohexanedicarboxylic acid, 1,4-cyclohexanedicarboxylic acid, 1,2,3-cyclohexanetricarboxylic acid, 1,2,4-cyclohexanetricarboxylic acid, 1,3,5-cyclohexanetricarboxylic acid, 1,2,3,4-cyclohexanetetracarboxylic acid, 1,2,3,5-cyclohexanetetracarboxylic acid, 1,2,4,5-cyclohexanetetracarboxylic acid and cyclohexanehexacarboxylic acid, which do not limit the invention.

Examples of the aromatic carboxylic acid compound usable in the invention are 1,2-benzene dicarboxylic acid, 1,3-benzene dicarboxylic acid, 1,4-benzene dicarboxylic acid, 1,2,3-benzene tricarboxylic acid, 1,2,4-benzene tricarboxylic acid, 1,3,5-benzene tricarboxylic acid, 1,2,3,4-benzene tetracarboxylic acid, 1,2,3,5-benzene tetracarboxylic acid, 1,2,4,5-benzene tetracarboxylic acid and benzene hexacarboxylic acid, which do not limit the invention.

Examples of the multivalent alcohol compound usable in this invention are ethylene glycol, 1,3-propanediol, 1,6-hexanediol, diethylene glycol, neopentyl glycol and 1,2,3-propanetriol, which do not limit the invention.

Examples of the alkali-soluble polymer included in a barrier film of this invention are polyvinyl alcohol, polyacrylic acid and polyvinyl hexafluoroisopropyl alcohol, which do not limit the invention.

The first pattern formation method of this invention includes the steps of forming a resist film on a substrate; forming, on the resist film, a barrier film including a multivalent carboxylic acid compound and an alkali-soluble polymer; performing exposure through a desired mask with a liquid provided on the barrier film; removing the barrier film after the exposure; and forming a resist pattern through development after removing the barrier film.

In the first pattern formation method, since the multivalent carboxylic acid compound included in the barrier film is easily adhered onto the surface of the resist film, particles having been adhered to the surface of the resist film are removed in removing the barrier film. Therefore, the development of the resist film is not inhibited. As a result, the shape of the resist pattern made of the resist film is never degraded.

The second pattern formation method of this invention includes the steps of forming a resist film on a substrate; forming, on the resist film, a barrier film including a multivalent carboxylic acid compound and an alkali-soluble polymer; performing exposure through a desired mask with a liquid provided on the barrier film; and removing the barrier film and forming a resist pattern by performing development after the exposure.

In the second pattern formation method, since the multivalent carboxylic acid compound included in the barrier film is easily adhered onto the surface of the resist film, particles having been adhered to the surface of the resist film are removed in removing the barrier film. Furthermore, since the barrier film is removed simultaneously with the development, the resist film can be prevented from remaining partly undissolved. As a result, the shape of the resist pattern made of the resist film is never degraded.

The third pattern formation method of this invention includes the steps of forming a resist film on a substrate; forming, on the resist film, a barrier film including a multivalent alcohol compound and an alkali-soluble polymer; performing exposure through a desired mask with a liquid provided on the barrier film; removing the barrier film after the exposure; and forming a resist pattern through development after removing the barrier film.

In the third pattern formation method, since the multivalent alcohol compound included in the barrier film is easily adhered onto the surface of the resist film, particles having been adhered to the surface of the resist film are removed in removing the barrier film. Therefore, the development of the resist film is not inhibited. As a result, the shape of the resist pattern made of the resist film is never degraded.

The fourth pattern formation method of this invention includes the steps of forming a resist film on a substrate; forming, on the resist film, a barrier film including a multivalent alcohol compound and an alkali-soluble polymer; performing exposure through a desired mask with a liquid provided on the barrier film; and removing the barrier film and forming a resist pattern by performing development after the exposure.

In the fourth pattern formation method, since the multivalent alcohol compound included in the barrier film is easily adhered onto the surface of the resist film, particles having been adhered to the surface of the resist film are removed in removing the barrier film. Furthermore, since the barrier film is removed simultaneously with the development, the resist film can be prevented from remaining partly undissolved. As a result, the shape of the resist pattern made of the resist film is never degraded.

A difference between the first pattern formation method and the second pattern formation method and a difference between the third pattern formation method and the fourth pattern formation method are as follows: In the first pattern formation method and the third pattern formation method, the barrier film formed on the resist film is removed before the development. On the other hand, in the second pattern formation method and the fourth pattern formation method, the barrier film formed on the resist film is removed with a developer during the development. In the first pattern formation method and the third pattern formation method, the barrier film is removed before the development, and hence, the development is proceeded in a general manner. In the second pattern formation method and the fourth pattern formation method, since the barrier film is removed during the development, the dissolution characteristic of the resist film can be controlled, resulting in attaining an effect to improve the dissolution characteristic of the resist film. The control of the dissolution characteristic will be described later.

Each of the first through fourth pattern formation methods preferably further includes a step of annealing the barrier film between the step of forming a barrier film and the step of performing exposure. When the barrier film is annealed after forming it, the denseness of the barrier film is improved so as to further increase the insoluble property in the immersion liquid. When the denseness of the barrier film is improved too much, it is difficult to dissolve the barrier film for removing it, and therefore, it is necessary to anneal it at a temperature in an appropriate range. The appropriate range of the temperature for annealing the barrier film for improving its denseness is 100° C. through 150° C., which does not limit the invention.

In the barrier film material used in each of the first through fourth pattern formation methods, the multivalent carboxylic acid compound or the multivalent alcohol compound is added to the alkali-soluble polymer included in the barrier film in a range from an extent that the effect of the addition can be exhibited to an extent that the film property of the barrier film is not degraded. In using a saturated aliphatic carboxylic acid compound or a saturated cyclic carboxylic acid compound, the content is 0.1 wt % through 50 wt % and more preferably 10 wt % through 30 wt %. Alternatively, in using an unsaturated aliphatic carboxylic acid compound or an aromatic carboxylic acid compound having a double bond, the content is approximately 0.01 wt % through 5 wt % in consideration of light absorption. In using a multivalent alcohol compound, the content is approximately 0.1 wt % through 50 wt % and more preferably approximately 10 wt % through 30 wt %.

Furthermore, in the barrier film material used in each of the first through fourth pattern formation methods, the alkali-soluble polymer is polyvinyl alcohol, polyacrylic acid or polyvinyl hexafluoroisopropyl alcohol, which does not limit the invention.

In each of the first through fourth pattern formation methods, the immersion liquid for the immersion exposure technique may be water or an acidic solution, which does not limit the invention. Examples of the acidic solution is a cesium sulfate aqueous solution or a phosphoric acid aqueous solution, which does not limit the invention. Also, the immersion liquid may include an additive such as a surface active agent in this invention.

In each of the first through fourth pattern formation methods, the exposing light may be KrF excimer laser, $Xe_2$ laser, ArF excimer laser, $F_2$ laser, KrAr laser or $Ar_2$ laser, which does not limit the invention.

As described above, according to the barrier film material or the pattern formation method using the same of this invention, a barrier film is formed by using a barrier film material between a resist film and a liquid for the immersion exposure technique, and hence, the influence on the resist film of the immersion liquid can be prevented. Furthermore, since the multivalent carboxylic acid compound or the multivalent alcohol compound included in the barrier film is easily adhered onto the surface of the resist film, particles having been adhered to the surface of the resist film are removed in removing the barrier film. Furthermore, in the case where the barrier film is removed simultaneously with the development, the resist film can be prevented from remaining partly undissolved. As a result, the resist film is uniformly developed, so that a fine pattern can be formed in a good shape.

DETAILED DESCRIPTION OF THE INVENTION

Embodiment 1

A pattern formation method using a barrier film material according to Embodiment 1 of the invention will now be described with reference to FIGS. 1A through 1D, 2A and 2B.

First, a resist material having the following composition is prepared:

| | |
|---|---:|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Figure 1A:
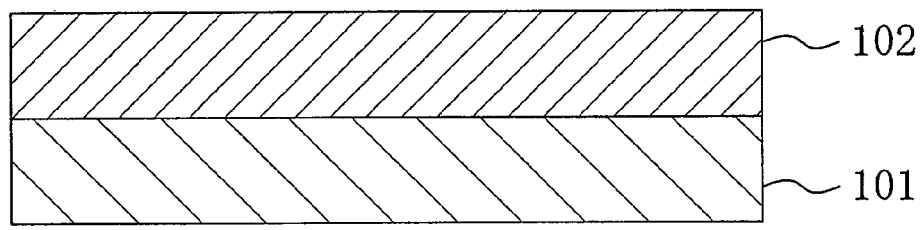
FIGS. 1A, 1B, 1C and 1D are cross-sectional views for showing procedures in a pattern formation method according to Embodiment 1 of the invention.

Next, as shown in FIG. 1A, the aforementioned chemically amplified resist material is applied on a substrate 101 so as to form a resist film 102 with a thickness of 0.35 μm.

Figure 1B:
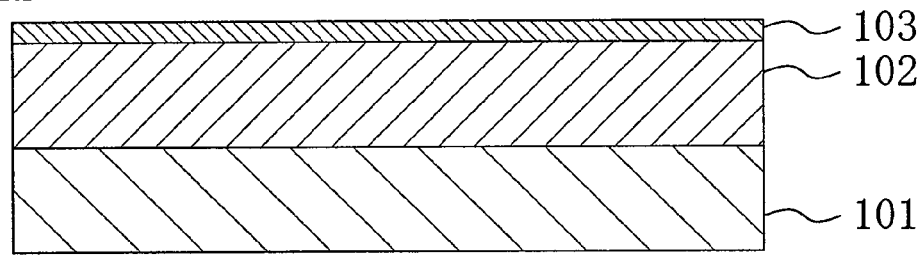

Then, as shown in FIG. 1B, by using a barrier film material having the following composition, a barrier film 103 is formed on the resist film 102 by, for example, spin coating:

| | |
|---|---:|
| Alkali-soluble polymer: polyvinyl hexafluoroisopropyl alcohol | 1 g |
| Multivalent carboxylic acid compound: succinic acid | 0.1 g |
| Solvent: n-butyl alcohol | 20 g |

Figure 1C:
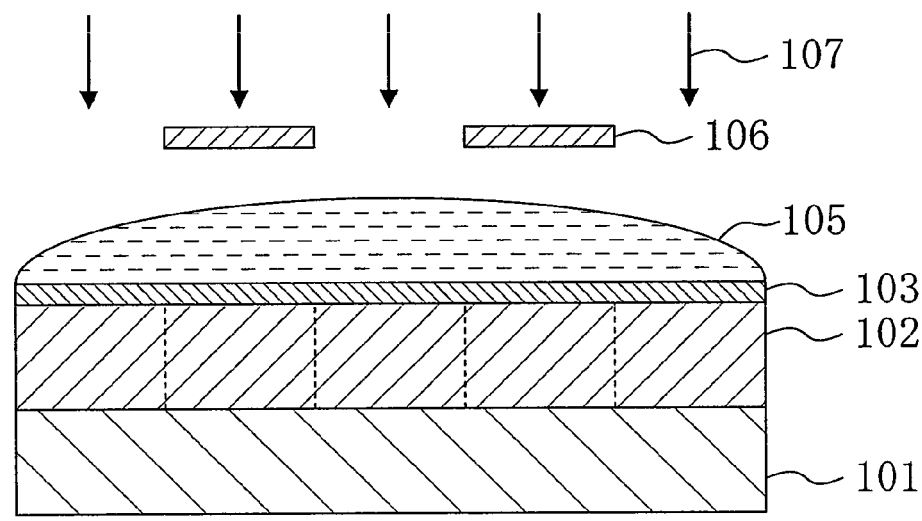

Then, as shown in FIG. 1C, with a liquid 105 of water provided on the barrier film 103 by, for example, a puddle method, pattern exposure is carried out by irradiating the resist film 102 through the barrier film 103 with exposing light 107 of ArF excimer laser with NA of 0.68 having passed through a mask 106.

Figure 1D:
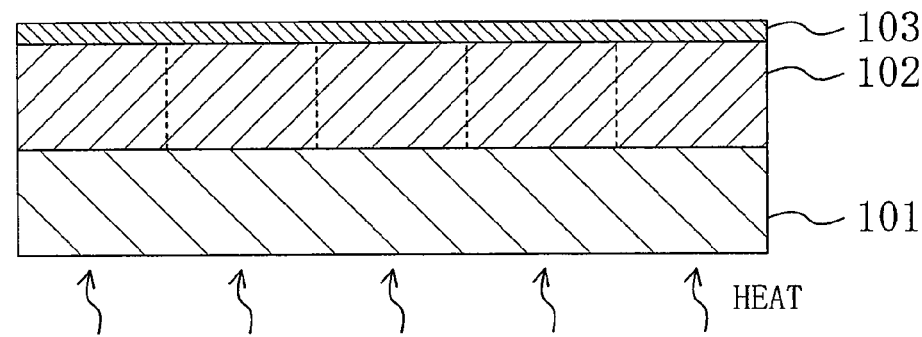

After the pattern exposure, as shown in FIG. 1D, the resist film 102 is baked with a hot plate at a temperature of 105° C. for 60 seconds.

Figure 2A:
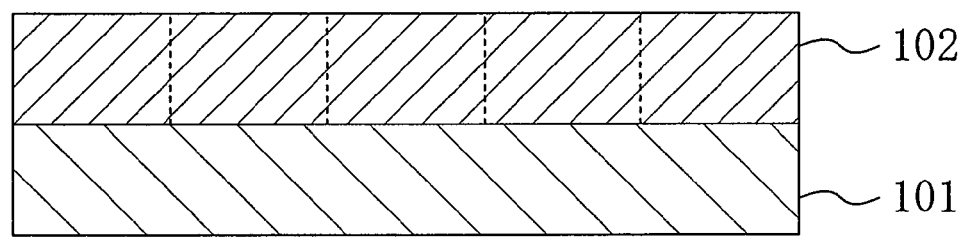
FIGS. 2A and 2B are cross-sectional views for showing other procedures in the pattern formation method of Embodiment 1.
Figure 2B:
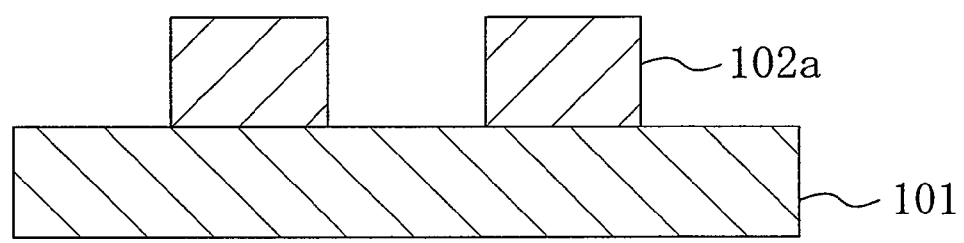

Next, as shown in FIG. 2A, the barrier film 103 is removed by using a 0.005 wt % tetramethylammonium hydroxide aqueous solution (diluted alkaline developer), and thereafter, the resultant resist film 102 is developed with a 2.38 wt % tetramethylammonium hydroxide developer (an alkaline developer). In this manner, a resist pattern 102a made of an unexposed portion of the resist film 102 and having a line width of 0.09 μm is formed in a good shape as shown in FIG. 2B.

In this manner, according to Embodiment 1, since the multivalent carboxylic acid compound included in the barrier film is easily adhered onto the surface of the resist film, particles having been adhered to the surface of the resist film are removed in removing the barrier film. Therefore, the development of the resist film is not inhibited. As a result, the shape of the resist pattern 102a made of the resist film 102 is never degraded.

Embodiment 2

A pattern formation method using a barrier film material according to Embodiment 2 of the invention will now be described with reference to FIGS. 3A through 3D and 4A through 4C.

First, a resist material having the following composition is prepared:

| | |
|---|---:|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Figure 3A:
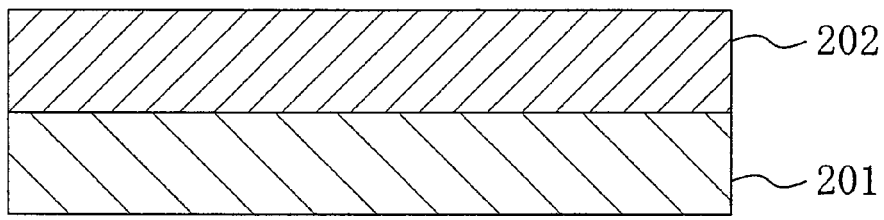
FIGS. 3A, 3B, 3C and 3D are cross-sectional views for showing procedures in a pattern formation method according to Embodiment 2 of the invention.

Next, as shown in FIG. 3A, the aforementioned chemically amplified resist material is applied on a substrate 201 so as to form a resist film 202 with a thickness of 0.35 μm.

Figure 3B:
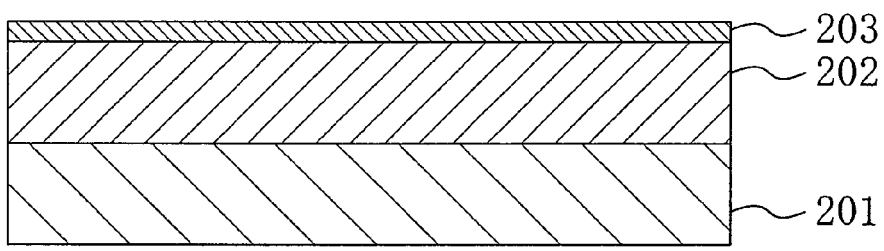

Then, as shown in FIG. 3B, by using a barrier film material having the following composition, a barrier film 203 is formed on the resist film 202 by, for example, the spin coating:

| | |
|---|---:|
| Alkali-soluble polymer: polyvinyl hexafluoroisopropyl alcohol | 1 g |
| Multivalent carboxylic acid compound: succinic acid | 0.1 g |
| Solvent: n-butyl alcohol | 20 g |

Figure 3C:
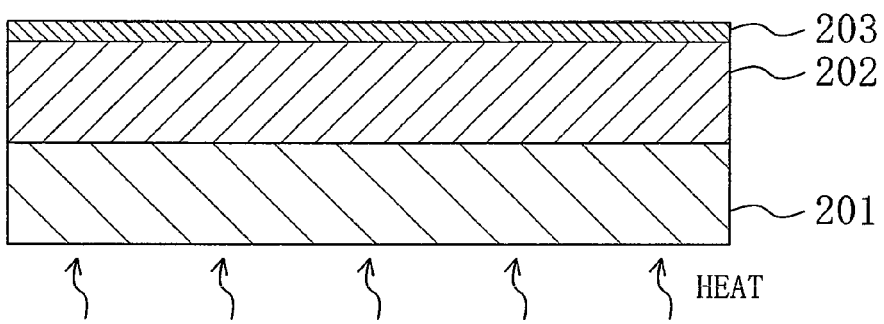

Next, as shown in FIG. 3C, the resultant barrier film 203 is annealed with a hot plate at a temperature of 120° C. for 90 seconds, so as to improve the denseness of the barrier film 203.

Figure 3D:
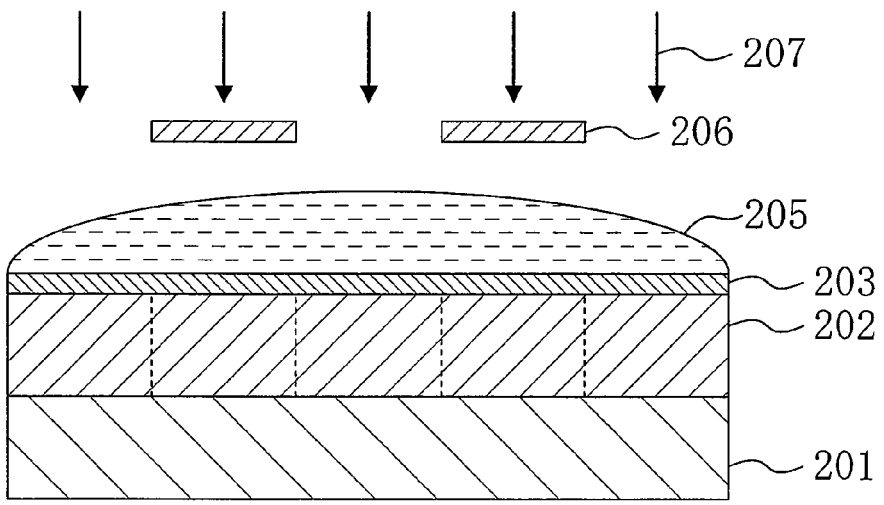

Thereafter, as shown in FIG. 3D, with an immersion liquid 205 of water provided on the barrier film 203 by, for example, the puddle method, pattern exposure is carried out by irradiating the resist film 202 through the barrier film 203 with exposing light 207 of ArF excimer laser with NA of 0.68 having passed through a mask 206.

Figure 4A:
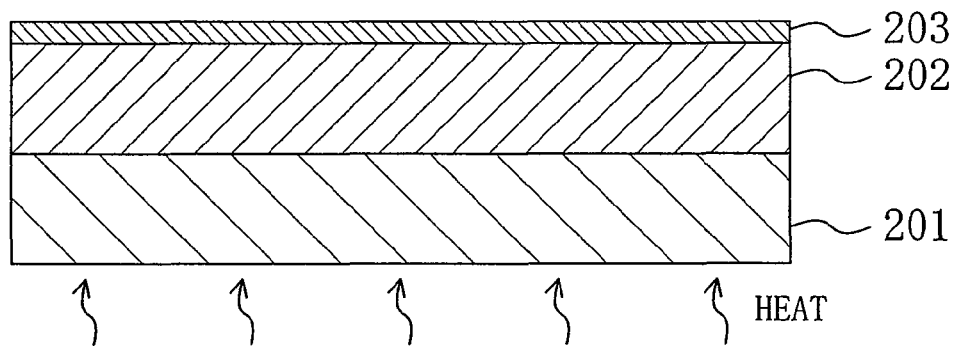
FIGS. 4A, 4B and 4C are cross-sectional views for showing other procedures in the pattern formation method of Embodiment 2.

After the pattern exposure, as shown in FIG. 4A, the resist film 202 is baked with a hot plate at a temperature of 105° C. for 60 seconds.

Figure 4B:
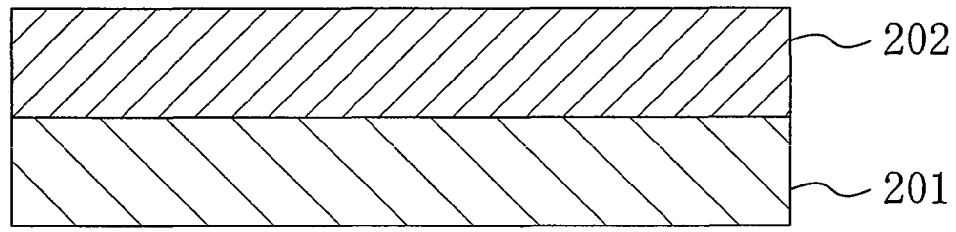
Figure 4C:
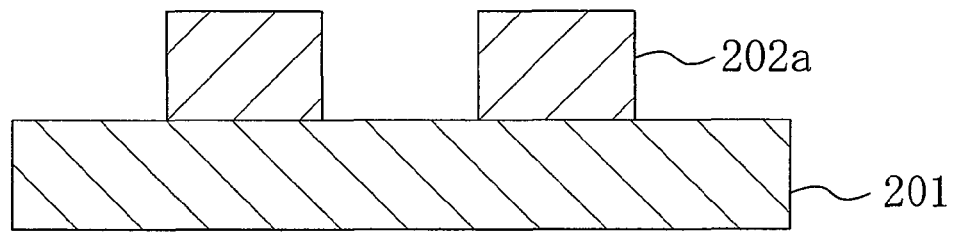

Next, as shown in FIG. 4B, the barrier film 203 is removed by using a 0.005 wt % tetramethylammonium hydroxide aqueous solution, and then, the resultant resist film 202 is developed with a 2.38 wt % tetramethylammonium hydroxide aqueous solution. In this manner, a resist pattern 202a made of an unexposed portion of the resist film 202 and having a line width of 0.09 μm is formed in a good shape as shown in FIG. 4C.

In this manner, according to Embodiment 2, since the multivalent carboxylic acid compound included in the barrier film is easily adhered onto the surface of the resist film, particles having been adhered to the surface of the resist film are removed in removing the barrier film. Therefore, the development of the resist film is not inhibited. As a result, the shape of the resist pattern 202a made of the resist film 202 is never degraded.

Moreover, since the denseness of the barrier film 203 is improved by annealing it before the pattern exposure as shown in FIG. 3C, the insoluble property of the barrier film 203 in the immersion liquid 205 is improved. Therefore, the function of the barrier film 203 as a barrier for preventing the acid generator or the like from eluting from the resist film 202 into the immersion liquid 205 can be improved.

Embodiment 3

A pattern formation method using a barrier film material according to Embodiment 3 of the invention will now be described with reference to FIGS. 5A through 5D, 6A and 6B.

First, a resist material having the following composition is prepared:

| | |
|---|---:|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Figure 5A:
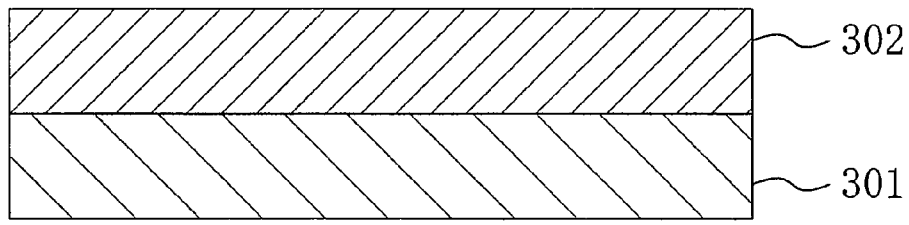
FIGS. 5A, 5B, 5C and 5D are cross-sectional views for showing procedures in a pattern formation method according to Embodiment 3 of the invention.

Next, as shown in FIG. 5A, the aforementioned chemically amplified resist material is applied on a substrate 301 so as to form a resist film 302 with a thickness of 0.35 μm.

Figure 5B:
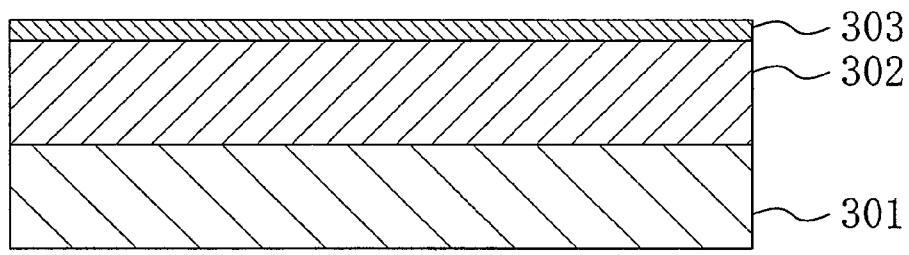

Then, as shown in FIG. 5B, by using a barrier film material having the following composition, a barrier film 303 is formed on the resist film 302 by, for example, the spin coating:

| | |
|---|---|
| Alkali-soluble polymer: polyacrylic acid | 1 g |
| Multivalent carboxylic acid compound: 1,2,4-cyclohexanetricarboxylic acid | 0.12 g |
| Solvent: n-butyl alcohol | 20 g |

Figure 5C:
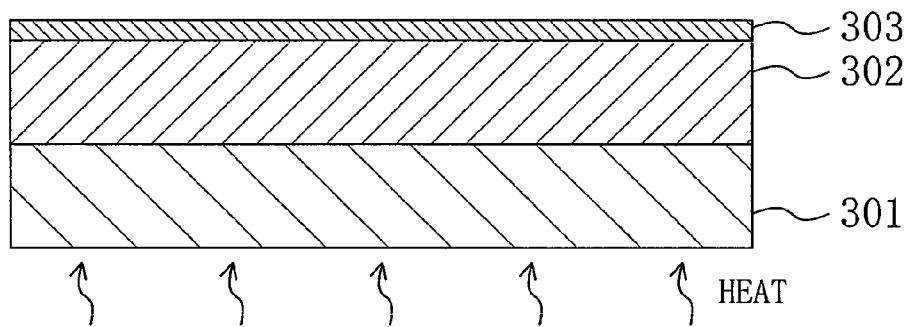

Thereafter, as shown in FIG. 5C, the resultant barrier film 303 is annealed with a hot plate at a temperature of 120° C. for 90 seconds, so as to improve the denseness of the barrier film 303.

Figure 5D:
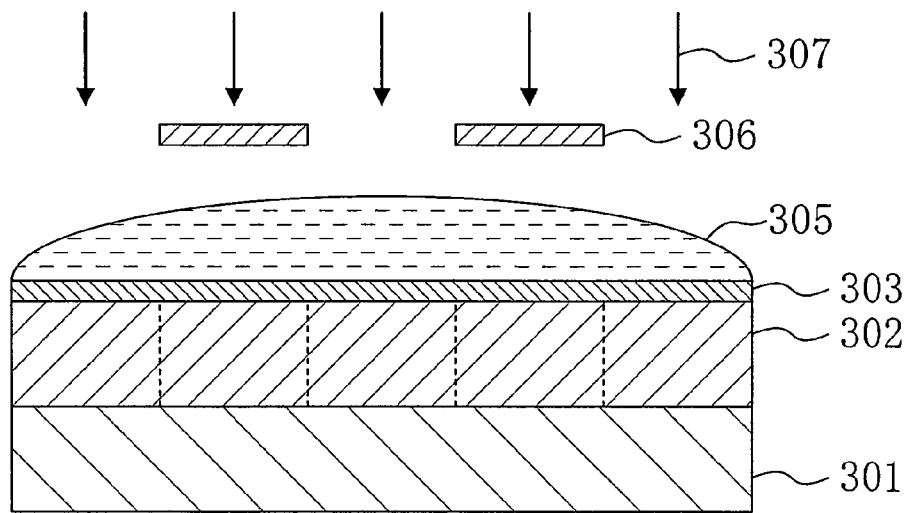

Then, as shown in FIG. 5D, with an immersion liquid 305 of water provided on the barrier film 303 by, for example, the puddle method, pattern exposure is carried out by irradiating the resist film 302 through the barrier film 303 with exposing light 307 of ArF excimer laser with NA of 0.68 having passed through a mask 306.

Figure 6A:
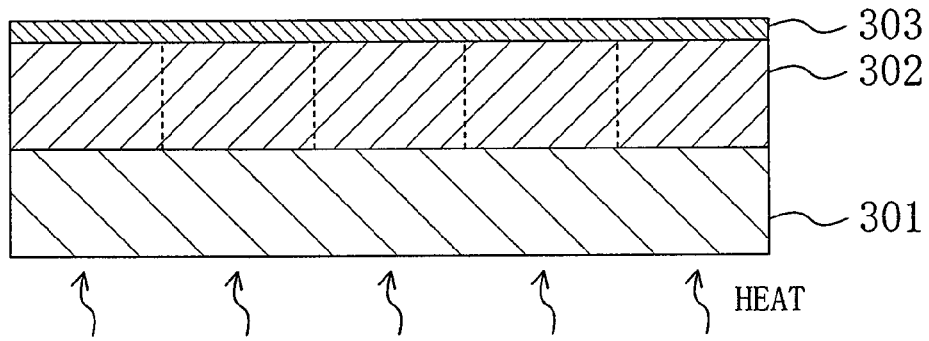
FIGS. 6A and 6B are cross-sectional views for showing other procedures in the pattern formation method of Embodiment 3.

After the pattern exposure, as shown in FIG. 6A, the resist film 302 is baked with a hot plate at a temperature of 105° C. for 60 seconds.

Figure 6B:
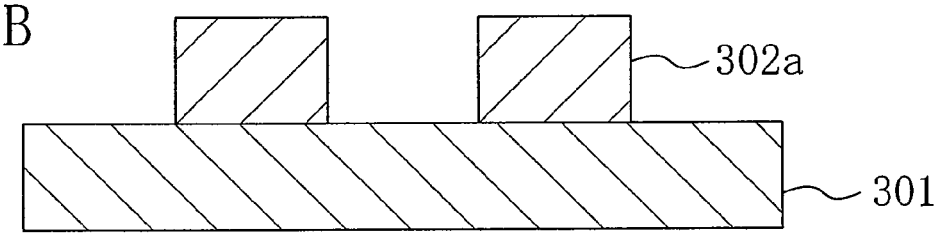

Next, the barrier film 303 is removed and the baked resist film 302 is developed by using a 2.38 wt % tetramethylammonium hydroxide aqueous solution. In this manner, a resist pattern 302a made of an unexposed portion of the resist film 302 and having a line width of 0.09 μm is formed in a good shape as shown in FIG. 6B.

In this manner, according to Embodiment 3, since the multivalent carboxylic acid compound included in the barrier film is easily adhered onto the surface of the resist film, particles having been adhered to the surface of the resist film are removed in removing the barrier film. Furthermore, since the barrier film is removed simultaneously with the development, the resist film can be prevented from remaining partly undissolved. As a result, the shape of the resist pattern 302a made of the resist film 302 is never degraded.

Moreover, in Embodiment 3, the barrier film 303 is annealed for improving its denseness before the pattern exposure as shown in FIG. 5C, and hence, the insoluble property of the barrier film 303 in the immersion liquid 305 is improved. Therefore, the function of the barrier film 303 as a barrier for preventing the acid generator or the like from eluting from the resist film 302 into the immersion liquid 305 can be improved.

In the pattern formation method of Embodiment 3, the barrier film 303 is removed by using the alkaline developer during the development differently from Embodiments 1 and 2. Thus, the dissolution characteristic of the resist film 302 can be controlled. The control of the dissolution characteristic will now be described with reference to the drawing.

Figure 7:
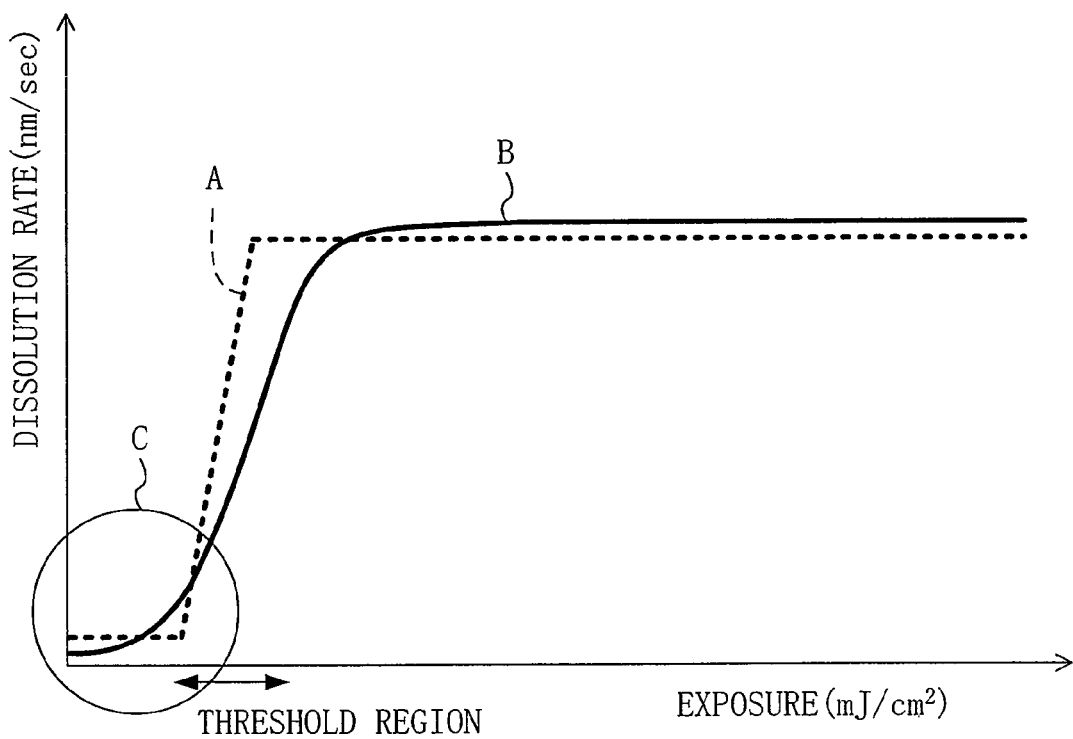
FIG. 7 is a graph for explaining control of solubility of a resist film in the pattern formation method of Embodiment 3.

In general, when the dissolution characteristic of a resist film in a developer is high, the dissolution rate is abruptly increased when exposure exceeds a given threshold value as shown with a graph A of a broken line in FIG. 7. As the change of the dissolution rate against the exposure is more abrupt, a difference in the solubility between an exposed portion and an unexposed portion of the resist film 302 is larger, and hence, the resist pattern 302a can attain higher resolution, namely, can be formed in a better shape. Accordingly, in the case where the barrier film 303 is removed simultaneously with the development, the dissolution rate is wholly lowered during the removal of the barrier film 303 as shown with a graph B of a solid line in FIG. 7, and hence, the change in a portion surrounded with a circle C of the graph B can be made flatter to be closer to the flat graph A. As a result, in the case where the actual resist film has the dissolution characteristic as shown with the graph B, the dissolution rate attained with smaller exposure can be adjusted to attain a comparatively constant solution state with a low dissolution rate even if the small exposure is varied to some extent. Accordingly, the difference in the solubility between an exposed portion and an unexposed portion of the resist film 302 can be substantially increased, resulting in easily forming the resist pattern in a good shape.

Embodiment 4

A pattern formation method using a barrier film material according to Embodiment 4 of the invention will now be described with reference to FIGS. 8A through 8D, 9A and 9B.

First, a resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Figure 8A:
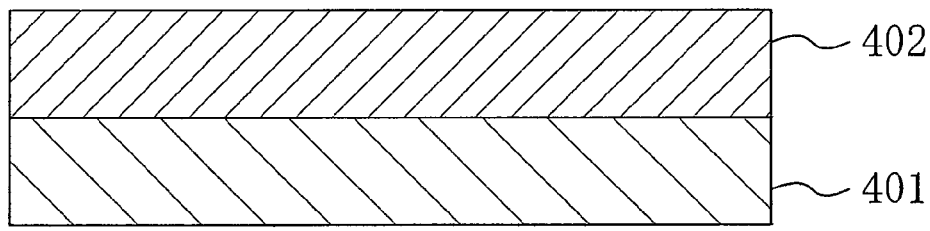
FIGS. 8A, 8B, 8C and 8D are cross-sectional views for showing procedures in a pattern formation method according to Embodiment 4 of the invention.

Next, as shown in FIG. 8A, the aforementioned chemically amplified resist material is applied on a substrate 401 so as to form a resist film 402 with a thickness of 0.35 μm.

Figure 8B:
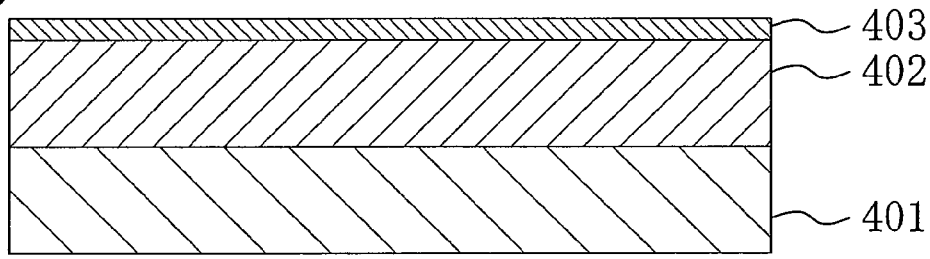

Then, as shown in FIG. 8B, by using a barrier film material having the following composition, a barrier film 403 is formed on the resist film 402 by, for example, the spin coating:

| | |
|---|---|
| Alkali-soluble polymer: polyacrylic acid | 1.2 g |
| Multivalent alcohol compound: ethylene glycol | 0.3 g |
| Solvent: isobutyl alcohol | 20 g |

Figure 8C:
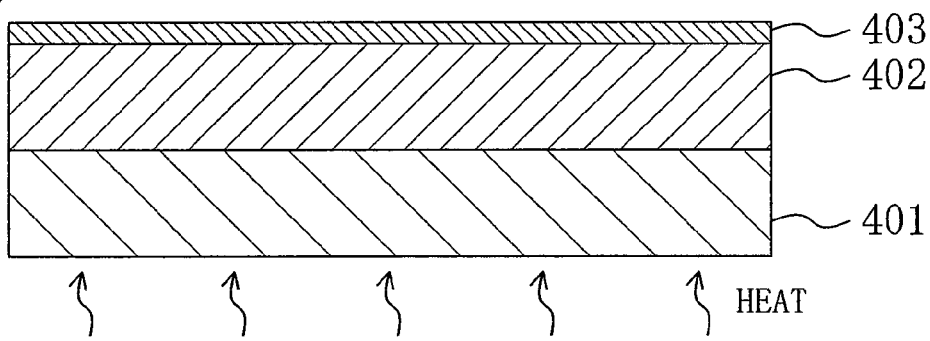

Next, as shown in FIG. 8C, the resultant barrier film 403 is annealed with a hot plate at a temperature of 120° C. for 90 seconds, so as to improve the denseness of the barrier film 403.

Figure 8D:
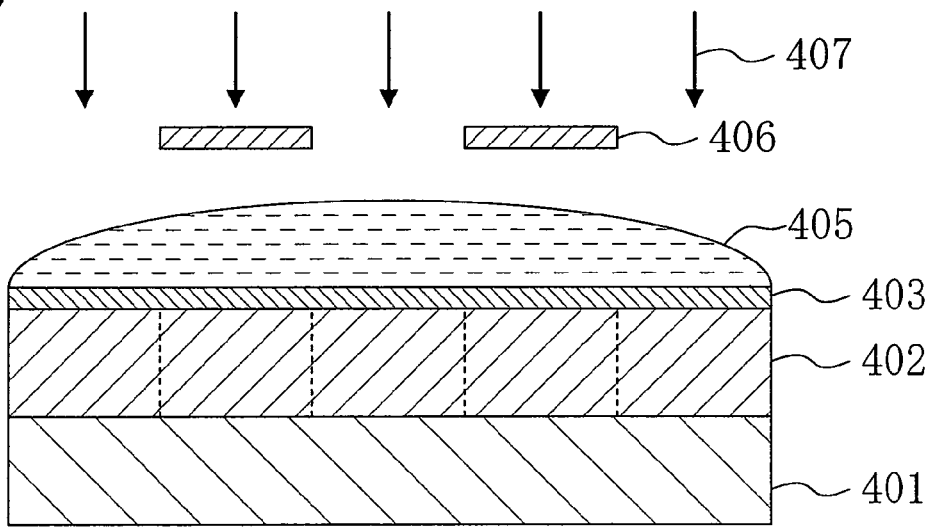

After the annealing, as shown in FIG. 8D, with an immersion liquid 405 of water provided on the barrier film 403 by, for example, the puddle method, pattern exposure is carried out by irradiating the resist film 402 through the barrier film 403 with exposing light 407 of ArF excimer laser with NA of 0.68 having passed through a mask 406.

Figure 9A:
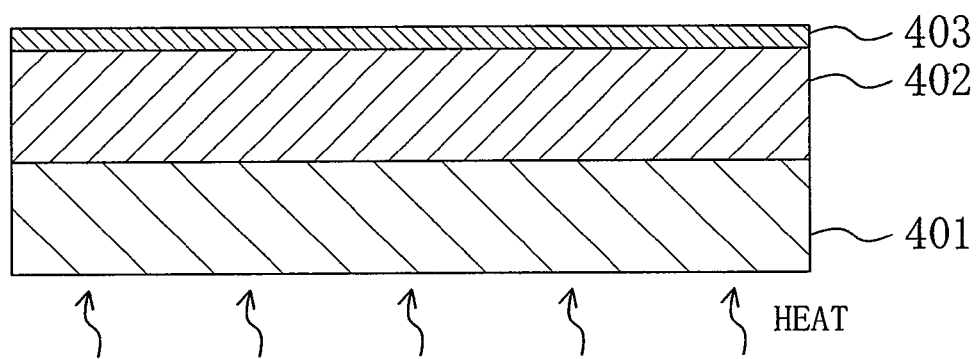
FIGS. 9A and 9B are cross-sectional views for showing other procedures in the pattern formation method of Embodiment 4.

After the pattern exposure, as shown in FIG. 9A, the resist film 402 is baked with a hot plate at a temperature of 105° C. for 60 seconds.

Figure 9B:
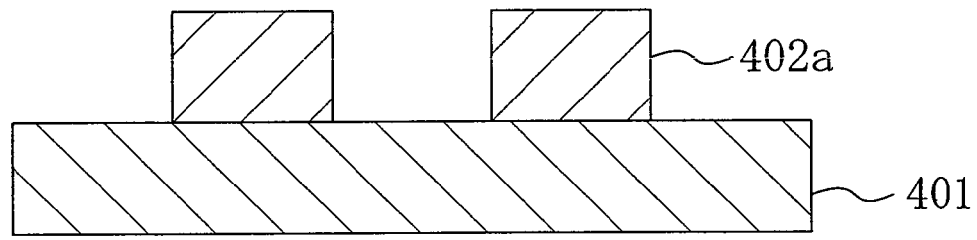

Next, the barrier film 403 is removed and the baked resist film 402 is developed with a 2.38 wt % tetramethylammonium hydroxide aqueous solution. In this manner, a resist pattern 402a made of an unexposed portion of the resist film 402 and having a line width of 0.09 μm is formed in a good shape as shown in FIG. 9B.

In this manner, according to Embodiment 4, since the multivalent alcohol compound included in the barrier film is easily adhered onto the surface of the resist film, particles having been adhered to the surface of the resist film are removed in removing the barrier film. Therefore, the development of the resist film is not inhibited. Furthermore, since the barrier film is removed simultaneously with the development, the resist film can be prevented from remaining partly undissolved. As a result, the shape of the resist pattern 402a made of the resist film 402 is never degraded.

Moreover, in Embodiment 4, the barrier film 403 is annealed for improving its denseness before the pattern exposure as shown in FIG. 8C, and hence, the insoluble property of the barrier film 403 in the immersion liquid 405 is improved. Therefore, the function of the barrier film 403 as a barrier for preventing the acid generator or the like from eluting from the resist film 402 into the immersion liquid 405 can be improved.

Embodiment 5

A pattern formation method using a barrier film material according to Embodiment 5 of the invention will now be described with reference to FIGS. 10A through 10D and 11A through 11C.

First, a resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium trifluoromethane sulfonate | 0.05 g |
| Quencher: triethanolamine | 0.002 g |
| Solvent: propylene glycol monomethyl ether acetate | 20 g |

Figure 10A:
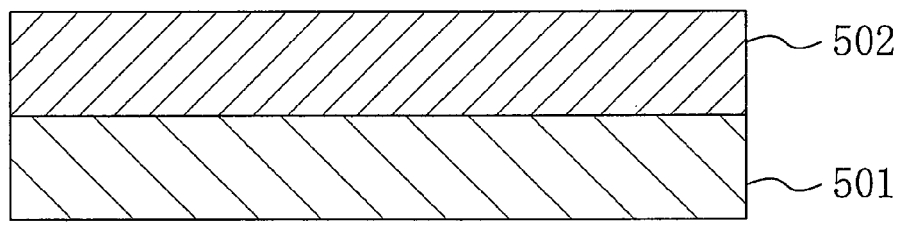
FIGS. 10A, 10B, 10C and 10D are cross-sectional views for showing procedures in a pattern formation method according to Embodiment 5 of the invention.

Next, as shown in FIG. 10A, the aforementioned chemically amplified resist material is applied on a substrate 501 so as to form a resist film 502 with a thickness of 0.35 μm.

Figure 10B:
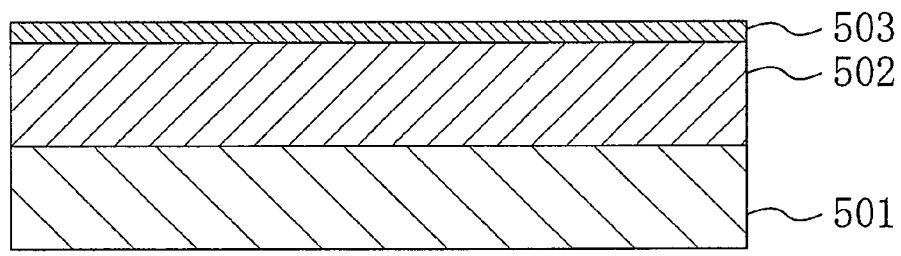

Then, as shown in FIG. 10B, by using a barrier film material having the following composition, a barrier film 503 is formed on the resist film 502 by, for example, the spin coating:

| | |
|---|---|
| Alkali-soluble polymer: polyvinyl hexafluoroisopropyl alcohol | 1 g |
| Multivalent alcohol compound: 1,2,3-propanetriol | 0.15 g |
| Solvent: isobutyl alcohol | 20 g |

Figure 10C:
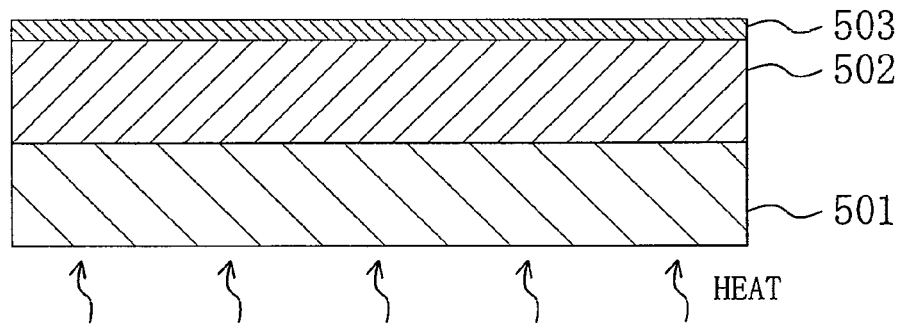

Next, as shown in FIG. 10C, the resultant barrier film 503 is annealed with a hot plate at a temperature of 120° C. for 90 seconds, so as to improve the denseness of the barrier film 503.

Figure 10D:
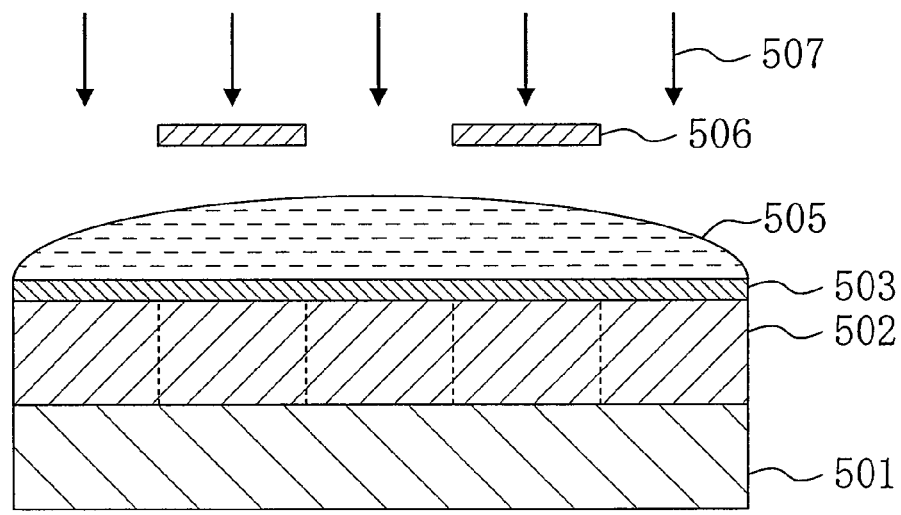

After the annealing, as shown in FIG. 10D, with an immersion liquid 505 of water provided on the barrier film 503 by, for example, the puddle method, pattern exposure is carried out by irradiating the resist film 502 through the barrier film 503 with exposing light 507 of ArF excimer laser with NA of 0.68 having passed through a mask 506.

Figure 11A:
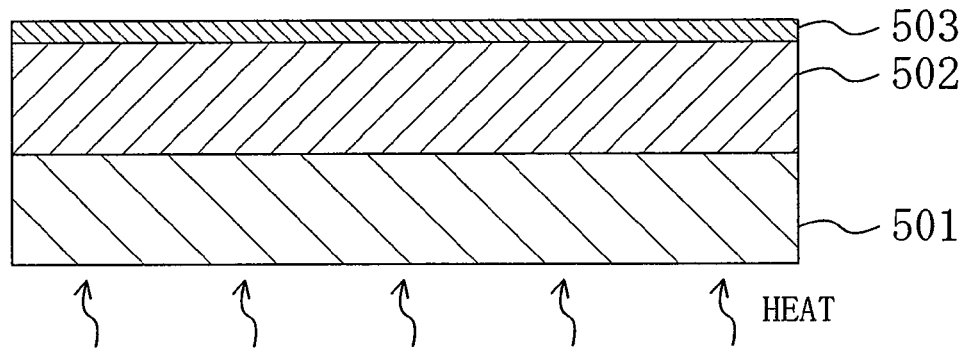
FIGS. 11A, 11B and 11C are cross-sectional views for showing other procedures in the pattern formation method of Embodiment 5.

After the pattern exposure, as shown in FIG. 11A, the resist film 502 is baked with a hot plate at a temperature of 105° C. for 60 seconds.

Figure 11B:
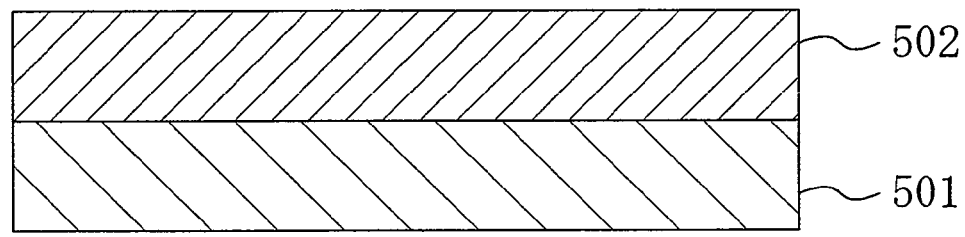
Figure 11C:
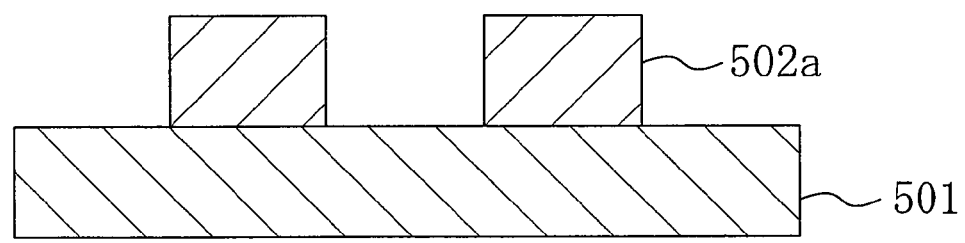
Figure 12A:
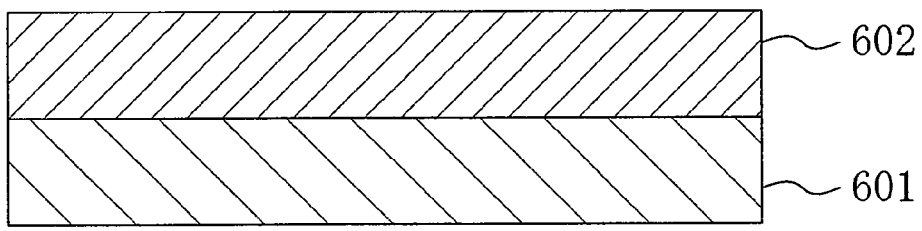
FIGS. 12A, 12B, 12C and 12D are cross-sectional views for showing procedures in a conventional pattern formation method employing immersion lithography.
Figure 12B:
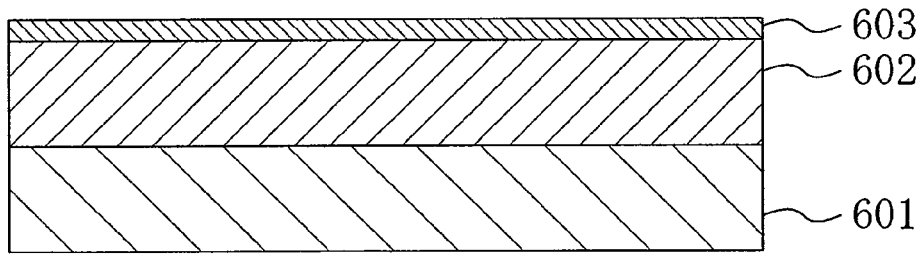
Figure 12C:
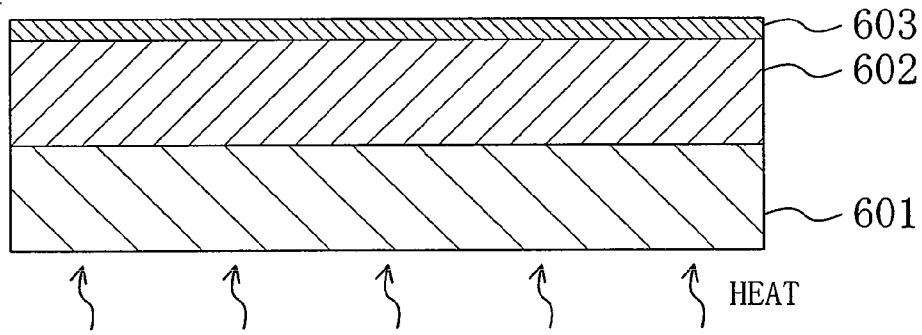
Figure 12D:
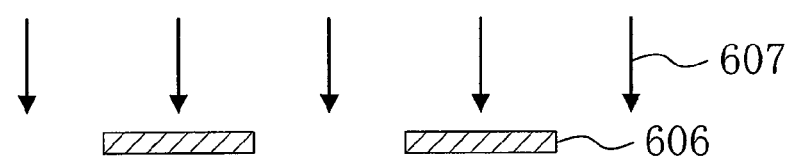
Figure 12D:
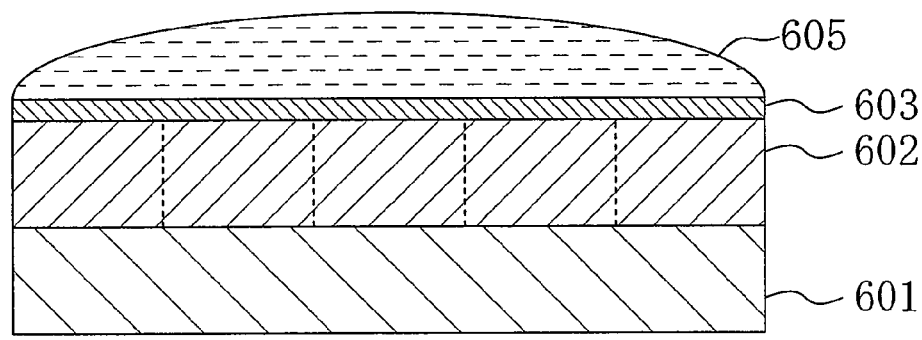
Figure 13A:
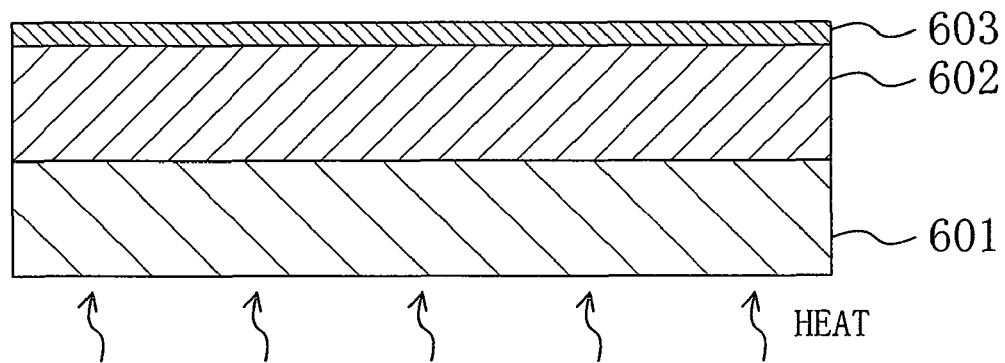
FIGS. 13A and 13B are cross-sectional views for showing other procedures in the conventional pattern formation method employing the immersion lithography.
Figure 13B:
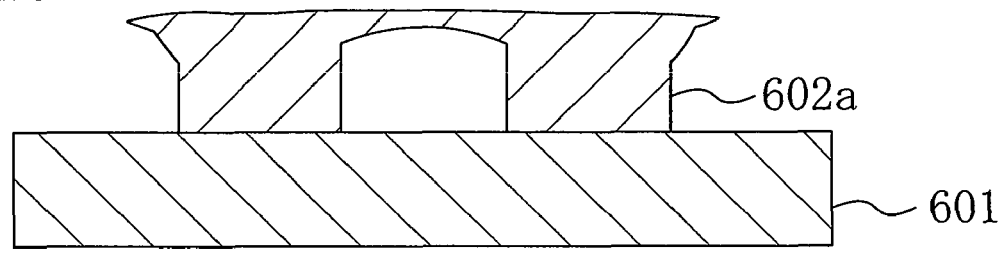

Next, as shown in FIG. 11B, the barrier film 503 is removed by using a 0.005 wt % tetramethylammonium hydroxide aqueous solution, and then, the resultant resist film 502 is developed with a 2.38 wt % tetramethylammonium hydroxide aqueous solution. In this manner, a resist pattern 502a made of an unexposed portion of the resist film 502 and having a line width of 0.09 μm is formed in a good shape as shown in FIG. 11C.

In this manner, according to Embodiment 5, since the multivalent alcohol compound included in the barrier film is easily adhered onto the surface of the resist film, particles having been adhered to the surface of the resist film are removed in removing the barrier film. As a result, the shape of the resist pattern 502a made of the resist film 502 is never degraded.

Moreover, in Embodiment 5, the barrier film 503 is annealed for improving its denseness before the pattern exposure as shown in FIG. 10C, and hence, the insoluble property of the barrier film 503 in the immersion liquid 505 is improved. Therefore, the function of the barrier film 503 as a barrier for preventing the acid generator or the like from eluting from the resist film 502 into the immersion liquid 505 can be improved.

In the pattern formation method of Embodiment 4, the barrier film 403 is removed with the alkaline developer during the development differently from Embodiment 5. Thus, the dissolution characteristic of the resist film 402 can be controlled. As a result, the difference in the solubility between an exposed portion and an unexposed portion of the resist film 402 can be substantially increased, resulting in easily forming the resist pattern 402a in a good shape.

In the pattern formation method of each of Embodiments 1 through 3, examples of the multivalent carboxylic acid compound are a saturated aliphatic carboxylic acid compound, an unsaturated aliphatic carboxylic acid compound, a saturated cyclic carboxylic acid compound and an aromatic carboxylic acid compound. A saturated aliphatic carboxylic acid compound or an unsaturated aliphatic carboxylic acid compound has a chain structure and hence has a high degree of freedom. Therefore, it has an advantage that it is easily adhered onto the surface of a resist film. Furthermore, a saturated cyclic carboxylic acid compound or an aromatic carboxylic acid compound can include three or more carboxylic groups owing to its structure. Therefore, it has an advantage that it can be easily adhered onto the surface of a resist film and can easily dissolve a surface portion of the resist film.

Specific examples of the saturated aliphatic carboxylic acid compound usable in the invention are malonic acid, succinic acid, glutaric acid, adipic acid, pimelic acid, suberic acid, azelaic acid and sebacic acid, which do not limit the invention.

Specific examples of the unsaturated aliphatic carboxylic acid compound usable in the invention are fumaric acid and maleic acid, which do not limit the invention.

Specific examples of the saturated cyclic carboxylic acid compound usable in the invention are 1,2-cyclohexanedicarboxylic acid, 1,3-cyclohexanedicarboxylic acid, 1,4-cyclohexanedicarboxylic acid, 1,2,3-cyclohexanetricarboxylic acid, 1,2,4-cyclohexanetricarboxylic acid, 1,3,5-cyclohexanetricarboxylic acid, 1,2,3,4-cyclohexanetetracarboxylic acid, 1,2,3,5-cyclohexanetetracarboxylic acid, 1,2,4,5-cyclohexanetetracarboxylic acid and cyclohexanehexacarboxylic acid, which do not limit the invention.

Examples of the aromatic carboxylic acid compound usable in the invention are 1,2-benzene dicarboxylic acid, 1,3-benzene dicarboxylic acid, 1,4-benzene dicarboxylic acid, 1,2,3-benzene tricarboxylic acid, 1,2,4-benzene tricarboxylic acid, 1,3,5-benzene tricarboxylic acid, 1,2,3,4-benzene tetracarboxyilc acid, 1,2,3,5-benzene tetracarboxylic acid, 1,2,4,5-benzene tetracarboxylic acid and benzene hexacarboxylic acid, which do not limit the invention.

In the pattern formation method of each of Embodiments 4 and 5, examples of the multivalent alcohol compound are ethylene glycol, 1,3-propanediol, 1,6-hexanediol, diethylene glycol, neopentyl glycol and 1,2,3-propanetriol, which do not limit the invention.

In each of Embodiments 1 through 5, examples of the alkali-soluble polymer included in a barrier film of this invention are polyvinyl alcohol, polyacrylic acid and polyvinyl hexafluoroisopropyl alcohol, which do not limit the invention.

Although water is used as the immersion liquid for the immersion exposure technology in the pattern formation method of each of Embodiments 1 through 5, an acidic solution may be used instead. As the acidic solution, a cesium sulfate aqueous solution, a phosphoric acid aqueous solution or the like may be used, but the acidic solution is not limited to them. Also, the immersion liquid may further include an additive such as a surface active agent.

Although the exposing light is ArF excimer laser in each of Embodiments 1 through 5, the exposing light may be KrF excimer laser, $Xe_2$ laser, $F_2$ laser, KrAr laser or $Ar_2$ laser instead.

As described so far, according to the barrier film material and the pattern formation method using the same of this invention, the influence on a resist film of a liquid for the immersion exposure technology can be prevented and a resist pattern can be formed in a good shape. Therefore, the invention is useful as a method for forming a fine pattern to be employed in fabrication process or the like for semiconductor devices.

What is claimed is:

1. A pattern formation method comprising the steps of:
    forming a resist film on a substrate;
    forming, on the resist film, a barrier film including a multivalent carboxylic acid and an alkali-soluble polymer;
    performing exposure through a desired mask with a liquid provided on the barrier film;
    removing the barrier film after the exposure; and
    forming a resist pattern through development after removing the barrier film, wherein:
    in the step of forming the barrier film, the barrier film dissolves a surface portion of the resist film, and
    the barrier film is formed by using a barrier film material including the alkali-soluble polymer, the multivalent carboxylic acid, and a solvent different from the multivalent carboxylic acid.

2. The pattern formation method of claim 1,
    wherein the multivalent carboxylic acid is a saturated aliphatic carboxylic acid, an unsaturated aliphatic carboxylic acid, a saturated cyclic carboxylic acid or an aromatic carboxylic acid.

3. The pattern formation method of claim 2,
    wherein the saturated aliphatic carboxylic acid is malonic acid, succinic acid, glutaric acid, adipic acid, pimelic acid, suberic acid, azelaic acid or sebacic acid.

4. The pattern formation method of claim 2,
    wherein the unsaturated aliphatic carboxylic acid is fumaric acid or maleic acid.

5. The pattern formation method of claim 2,
    wherein the saturated cyclic carboxylic acid is 1,2-cyclohexanedicarboxylic acid, 1,3-cyclohexanedicarboxylic acid, 1,4-cyclohexanedicarboxylic acid, 1,2,3-cyclohexanetricarboxylic acid, 1,2,4-cyclohexanetricarboxylic acid, 1,3,5-cyclohexanetricarboxylic acid, 1,2,3,4-cyclohexanetetracarboxylic acid, 1,2,3,5-cyclohexanetetracarboxylic acid, 1,2,4,5-cyclohexanetetracarboxylic acid or cyclohexanehexacarboxylic acid.

6. The pattern formation method of claim 2,
    wherein the aromatic carboxylic acid is 1,2-benzene dicarboxylic acid, 1,3-benzene dicarboxylic acid, 1,4-benzene dicarboxylic acid, 1,2,3-benzene tricarboxylic acid, 1,2,4-benzene tricarboxylic acid, 1,3,5-benzene tricarboxylic acid, 1,2,3,4-benzene tetracarboxyilc acid, 1,2,3,5-benzene tetracarboxylic acid, 1,2,4,5-benzene tetracarboxylic acid or benzene hexacarboxylic acid.

7. The pattern formation method of claim 1,
    wherein the alkali-soluble polymer is polyvinyl alcohol, polyacrylic acid or polyvinyl hexafluoroisopropyl alcohol.

8. The pattern formation method of claim 1, further comprising a step of annealing the barrier film between the step of forming a barrier film and the step of performing exposure.

9. The pattern formation method of claim 1,
    wherein the liquid is water or an acidic solution.

10. The pattern formation method of claim 9,
    wherein the acidic solution is a cesium sulfate aqueous solution or a phosphoric acid aqueous solution.

11. The pattern formation method of claim 1,
    wherein the exposing light is KrF excimer laser, $Xe_2$ laser, ArF excimer laser, $F_2$ laser, KrAr laser or $Ar_2$ laser.

12. A pattern formation method comprising the steps of:
    forming a resist film on a substrate;
    forming, on the resist film, a barrier film including a multivalent carboxylic acid and an alkali-soluble polymer;
    performing exposure through a desired mask with a liquid provided on the barrier film; and
    removing the barrier film and forming a resist pattern by performing development after the exposure, wherein:
    in the step of forming the barrier film, the barrier film dissolves a surface portion of the resist film, and
    the barrier film is formed by using a barrier film material including the alkali-soluble polymer, the multivalent carboxylic acid, and a solvent different from the multivalent carboxylic acid.

13. A pattern formation method comprising the steps of:
    forming a resist film on a substrate;
    forming, on the resist film, a barrier film including a multivalent alcohol and an alkali-soluble polymer;
    performing exposure through a desired mask with a liquid provided on the barrier film;
    removing the barrier film after the exposure; and
    forming a resist pattern through development after removing the barrier film, wherein:
    the barrier film is formed by using a barrier film material including the alkali-soluble polymer, the multivalent carboxylic acid, and a solvent different from the multivalent carboxylic acid, and
    the barrier film material includes the multivalent alcohol in a range of 10 wt % through 30 wt % with respect to the alkali-soluble polymer.

14. The pattern formation method of claim 13,
    wherein the multivalent alcohol is ethylene glycol, 1,3-propanediol, 1,6-hexanediol, diethylene glycol, neopentyl glycol or 1,2,3-propanetriol.

15. A pattern formation method comprising the steps of:
    forming a resist film on a substrate;
    forming, on the resist film, a barrier film including a multivalent alcohol and an alkali-soluble polymer;
    performing exposure through a desired mask with a liquid provided on the barrier film; and
    removing the barrier film and forming a resist pattern by performing development after the exposure, wherein:
    the barrier film is formed by using a barrier film material including the alkali-soluble polymer, the multivalent carboxylic acid, and a solvent different from the multivalent carboxylic acid, and
    the barrier film material includes the multivalent alcohol in a range of 10 wt % through 30 wt % with respect to the alkali-soluble polymer.

16. A barrier film material disposed on a resist film in immersion exposure technique using ArF excimer laser or $F_2$ laser as exposing light, the barrier film material comprising a multivalent carboxylic acid, an alkali-soluble polymer, and a solvent different from the multivalent carboxylic acid, wherein:
- the multivalent carboxylic acid is a saturated aliphatic carboxylic acid or a saturated cyclic carboxylic acid, and
- the saturated aliphatic carboxylic acid or the saturated cyclic carboxylic acid is included in a range of 0.1 wt % through 50 wt % with respect to the alkali-soluble polymer.

17. A barrier film material disposed on a resist film in immersion exposure technique using ArF excimer laser or $F_2$ laser as exposing light, the barrier film material comprising a multivalent carboxylic acid, an alkali-soluble polymer, and a solvent different from the multivalent carboxylic acid, wherein:
- the multivalent carboxylic acid is an unsaturated aliphatic carboxylic acid or an aromatic carboxylic acid, and
- the unsaturated aliphatic carboxylic acid or the aromatic carboxylic acid is included in a range of 0.01 wt % through 5 wt % with respect to the alkali-soluble polymer.

18. The barrier film material of claim 16,
wherein the saturated aliphatic carboxylic acid is malonic acid, succinic acid, glutaric acid, adipic acid, pimelic acid, suberic acid, azelaic acid or sebacic acid.

19. The barrier film material of claim 17,
wherein the unsaturated aliphatic carboxylic acid is fumaric acid or maleic acid.

20. The barrier film material of claim 16,
wherein the saturated cyclic carboxylic acid is 1,2-cyclohexanedicarboxylic acid, 1,3-cyclohexanedicarboxylic acid, 1,4-cyclohexanedicarboxylic acid, 1,2,3-cyclohexanetricarboxylic acid, 1,2,4-cyclohexanetricarboxylic acid, 1,3,5-cyclohexanetricarboxylic acid, 1,2,3,4-cyclohexanetetracarboxylic acid, 1,2,3,5-cyclohexanetetracarboxylic acid, 1,2,4,5-cyclohexanetetracarboxylic acid or cyclohexanehexacarboxylic acid.

21. The barrier film material of claim 17,
wherein the aromatic carboxylic acid is 1,2-benzene dicarboxylic acid, 1,3-benzene dicarboxylic acid, 1,4-benzene dicarboxylic acid, 1,2,3-benzene tricarboxylic acid, 1,2,4-benzene tricarboxylic acid, 1,3,5-benzene tricarboxylic acid, 1,2,3,4-benzene tetracarboxyilc acid, 1,2,3,5-benzene tetracarboxylic acid, 1,2,4,5-benzene tetracarboxylic acid or benzene hexacarboxylic acid.

22. A barrier film material disposed on a resist film in immersion exposure technique, the barrier film material comprising a multivalent alcohol, an alkali-soluble polymer, and a solvent different from the multivalent alcohol, wherein
the multivalent alcohol is included in a range of 10 wt % through 30 wt % with respect to the alkali-soluble polymer.

23. The barrier film material of claim 22,
wherein the multivalent alcohol is ethylene glycol, 1,3-propanediol, 1,6-hexanediol, diethylene glycol, neopentyl glycol or 1,2,3-propanetriol.

24. The barrier film material of claim 2, wherein
the barrier film material includes the saturated aliphatic carboxylic acid or the saturated cyclic carboxylic acid in a range of 0.1 wt % through 50 wt % with respect to the alkali-soluble polymer.

25. The barrier film material of claim 2, wherein
the barrier film material includes the unsaturated aliphatic carboxylic acid or the aromatic carboxylic acid in a range of 0.01 wt % through 5 wt % with respect to the alkali-soluble polymer.

\* \* \* \* \*